United States Patent
Sakai

(10) Patent No.: US 10,466,555 B2
(45) Date of Patent: Nov. 5, 2019

(54) LCD DEVICE

(71) Applicant: SHARP KABUSHIKI KAISHA, Sakai, Osaka (JP)

(72) Inventor: Tamotsu Sakai, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/761,428

(22) PCT Filed: Sep. 20, 2016

(86) PCT No.: PCT/JP2016/077622
§ 371 (c)(1),
(2) Date: Mar. 20, 2018

(87) PCT Pub. No.: WO2017/051789
PCT Pub. Date: Mar. 30, 2017

(65) Prior Publication Data
US 2018/0275472 A1  Sep. 27, 2018

(30) Foreign Application Priority Data

Sep. 25, 2015  (JP) .................. 2015-188736

(51) Int. Cl.
*G09G 3/36* (2006.01)
*G02F 1/1362* (2006.01)
*G02F 1/1345* (2006.01)
*H01L 27/12* (2006.01)

(52) U.S. Cl.
CPC .... *G02F 1/136286* (2013.01); *G02F 1/13452* (2013.01); *G09G 3/3614* (2013.01); *G09G 3/3677* (2013.01); *G09G 3/3688* (2013.01); *H01L 27/124* (2013.01); *G02F 2203/01* (2013.01); *G09G 2300/0426* (2013.01); *G09G 2310/0254* (2013.01); *G09G 2310/0278* (2013.01); *G09G 2310/061* (2013.01); *G09G 2320/0223* (2013.01); *G09G 2330/10* (2013.01)

(58) Field of Classification Search
CPC ........... G02F 1/13452; G02F 1/136286; G02F 2203/01; G09G 3/20; G09G 3/36; G09G 3/3677; G09G 2310/0254; G09G 2310/0278; G09G 2310/061; H01L 27/124
See application file for complete search history.

(56) References Cited

U.S. PATENT DOCUMENTS

2007/0085798 A1  4/2007  Hashimoto et al.
2008/0024404 A1  1/2008  Tanaka et al.

FOREIGN PATENT DOCUMENTS

| JP | 2002-108288 A | 4/2002 |
| JP | 2007-108457 A | 4/2007 |
| JP | 2008-015179 A | 1/2008 |
| JP | 2013-205502 A | 10/2013 |
| WO | 2015/064252 A1 | 5/2015 |

*Primary Examiner* — Stacy Khoo
(74) *Attorney, Agent, or Firm* — ScienBiziP, P.C.

(57) ABSTRACT

A high-speed-drive liquid crystal display device easily applicable to dot inversion driving is provided. Gate lines (GL1 to GL6) each has a shorter drive time in one frame than each one of gate lines (GLm to GL(m+5) and GL(n−5) to GLn).

4 Claims, 7 Drawing Sheets

LCD DEVICE

TECHNICAL FIELD

The present invention relates to a high-speed-drive liquid crystal display device.

BACKGROUND ART

High-speed driving of a liquid crystal display device is in demand. In particular, a liquid crystal display device configured to be driven by a color-field sequential system requires a driving speed several times as high as the driving speed of a liquid crystal display device configured to be driven by a common driving system. The color-field sequential system denotes a driving system for controlling a liquid crystal panel to sequentially display subframes in synchronism with a lighting timing of backlights. The subframes correspond to the respective three primary colors. The backlights correspond to the respective three primary colors.

In the liquid crystal display device, all pixels have to be charged sufficiently in order to prevent degradation of image quality.

PTL 1 discloses a technique for sufficiently charging all pixels in a high-speed-drive liquid crystal display device. In a liquid crystal driving method according to PTL 1, a horizontal scanning period corresponding to the positive polarity in which charging is difficult (sufficient charging requires time) is increased, and a horizontal scanning period corresponding to the negative polarity is reduced. Here, the sum of one horizontal scanning period corresponding to the positive polarity and one horizontal scanning period corresponding to the negative polarity equals two horizontal scanning periods in a common driving system. This enables all pixels to be sufficiently charged while a decrease in driving speed of the liquid crystal display device is suppressed.

CITATION LIST

Patent Literature

PTL 1: Japanese Unexamined Patent Application Publication No. 2002-108288 (published on Apr. 10, 2002)

SUMMARY OF INVENTION

Technical Problem

In a conventional liquid crystal display device, typically, liquid crystal display device driven by the liquid crystal driving method according to PTL 1, a source line closer to a source driver has a smaller time constant. Thus, a pixel closer to the source driver requires a shorter charging time. A reason why the source line closer to the source driver has a smaller time constant is as follows. That is, the closer the source driver, the shorter the wiring length of the source line, and thus, the resistance value becomes small, which leads to a smaller time constant. On the other hand, at a location farthest from the source driver, the resistance value is large correspondingly to the entire length of the source line, which leads to a large time constant. Note that a capacity component has substantially the same value even when the distance from the source driver varies.

A conventional liquid crystal display device, however, does not take the relationship between the distance of each pixel to the source driver and the time required to charge each pixel into consideration. Thus, charging pixels closer to the source driver take an unnecessarily longer time. The unnecessarily longer time hinders high-speed driving of the liquid crystal display device.

Moreover, a large-size liquid crystal display device, typically, a television set, requires performing so-called dot inversion driving for inverting the polarity by adjacent pixels in order to secure desired image quality. PTL 1 proposes a driving method adopting a polarity arrangement similar to the dot inversion driving, but the driving method cannot fully achieve the dot inversion driving. This is because in the driving method, a line of negative polarity in a row (a line reducing the horizontal scanning period) has to be included in the polarity arrangement. Thus, applying the liquid crystal driving method according to PTL 1 to the dot inversion driving is difficult.

In view of the above problem, it is an object of the present invention to provide a high-speed-drive liquid crystal display device easily applicable to dot inversion driving.

Solution to Problem

To solve the problem, a liquid crystal display device according to one aspect of the present invention includes: a plurality of first gate lines; a plurality of first source lines disposed to intersect the plurality of first gate lines; a first pixel formed at least one of intersections of the plurality of first gate lines and the plurality of first source lines; a first source driver configured to supply a first drive signal to end parts of the plurality of first source lines to drive the plurality of first source lines, wherein the plurality of first gate lines include a first group including one or a plurality of the first gate lines adjacent to each other, the first group including at least a first proximal gate line which is the first gate line closest to the first source driver, and a second group including one or a plurality of the first gate lines adjacent to each other, the second group being disposed on an opposite side of the first group from the source driver, and at least all the first gate lines included in the first group except for the first proximal gate line each have a shorter driving time in one frame than each of the first gate lines included in the second group.

Advantageous Effects of Invention

The one aspect of the present in enables a high-speed-drive liquid crystal display device easily applicable to dot inversion driving to be realized.

DESCRIPTION OF EMBODIMENTS

[First Embodiment]

Figure 1:
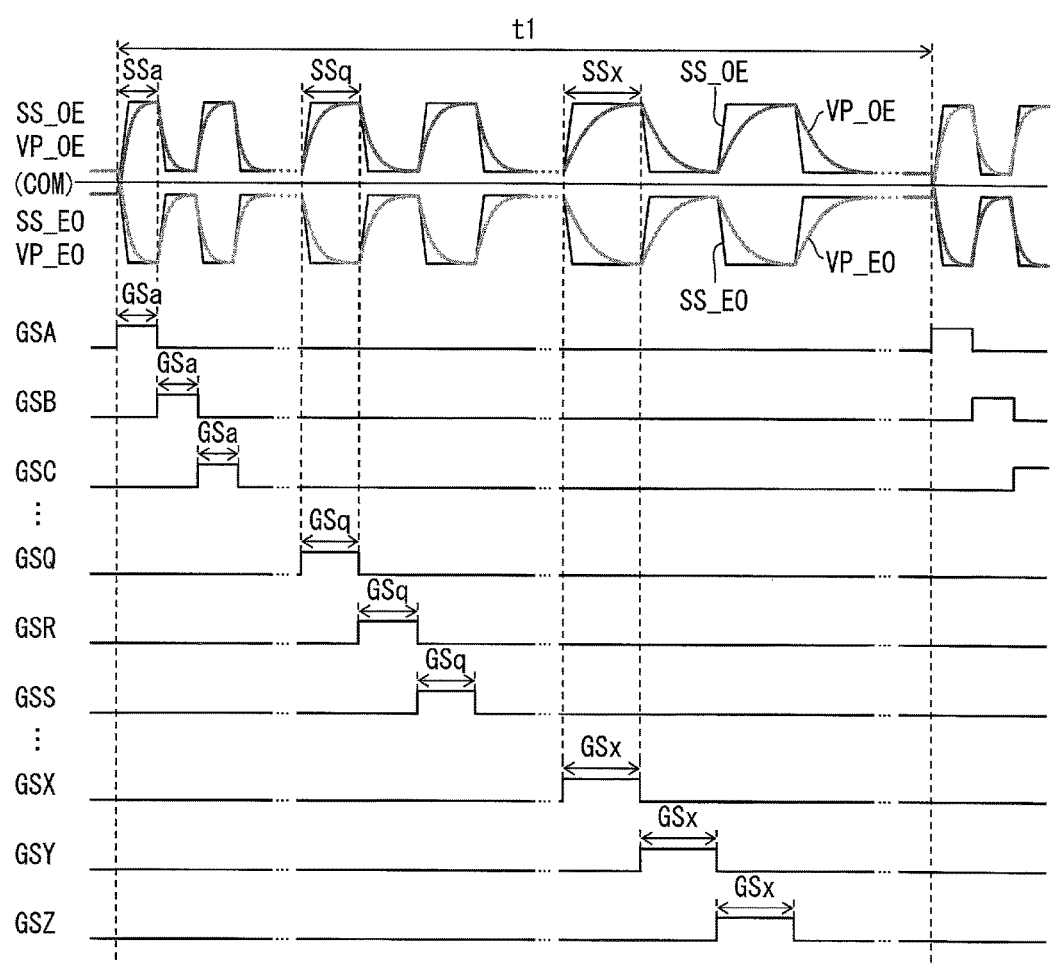
FIG. 1 is a timing chart illustrating driving of a liquid crystal display device according to a first embodiment of the present invention.
Figure 2:
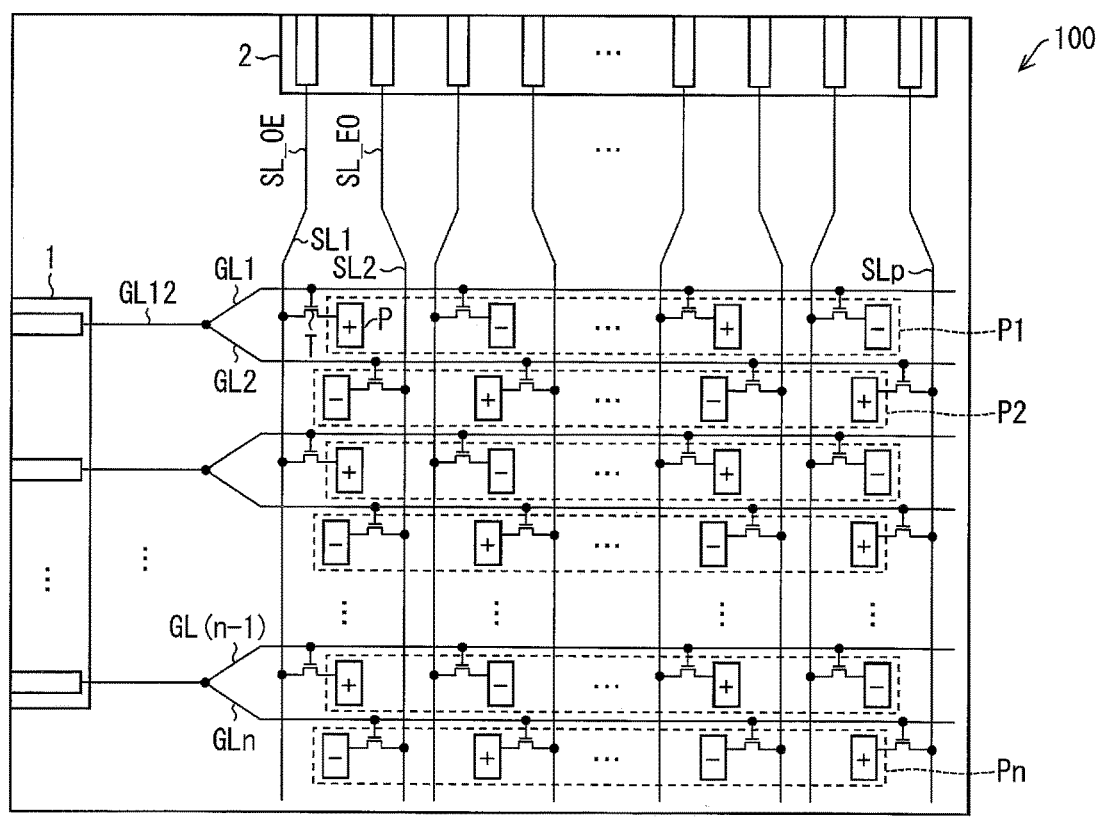
FIG. 2 is a block diagram illustrating main components of the liquid crystal display device according to the first embodiment of the present invention.

FIG. 1 is a timing chart illustrating driving of a liquid crystal display device 100 according to a first embodiment of the present invention. FIG. 2 is a block diagram illustrating main components of the liquid crystal display device 100 according to the first embodiment of the present invention.

As illustrated in FIG. 2, the liquid crystal display device 100 includes n (a plurality of) gate lines (first gate lines) GL, p (a plurality of) source lines (first source line) SL, a plurality of transistors T and pixels (first pixels) P, a gate driver 1, and a source driver (first source driver) 2.

In the liquid crystal display device 100, the gate lines GL are arranged to intersect the source lines SL. The gate lines GL are arranged from a side where the source driver 2 is provided, that is, from top to bottom in the order of a gate line (first proximal gate line) GL1, a gate line GL2, ..., a gate line GL(n−1), and a gate line GLn. The source lines SL are arranged in the order of a source line SL1, a source line SL2, ..., and a source line SLp from the gate driver 1.

The transistor T and the pixel P are formed at least one of intersections of the n gate lines GL and the p source lines SL. For one intersection of the gate line GL and the source line SL the gate of the transistor S is connected to the gate line GL, the source of the transistor T is connected to the source line SL, and the pixel P is connected to the drain of the transistor T.

Here, the p source lines SL are arranged from the source line SL1 to the source line SLp in the order of a source line SL_OE, a source line SL_EO, a source line SL_EO, and a source line SL_OE for each four source lines SL. Different signals may be supplied to the p source lines SL, but one of any two adjacent pixels of the plurality of pixels P is driven by the source line SL_OE, and the other of the two adjacent pixels is driven by the source line SL_EO. A connection relationship between each source line SL and each transistor T and pixel P is determined so as to be able to realize such driving.

Note that in FIG. 2, pixel groups P1 to Pn are defined. The pixel groups P1 to Pn are collections of the pixels P connected to the gate lines GL1 to GLn respectively via the corresponding transistors T.

The gate driver 1 is disposed on a side of the source line SL1 and is configured to supply a gate drive signal to the n gate lines GL to drive the n gate lines GL. The source driver 2 is disposed on an upper side of the gate line GL1 and is configured to supply a source drive signal (first drive signal) to the p source lines SL to drive the p source lines SL.

Here, the liquid crystal display device 100 is driven by dot inversion driving and so-called double-source driving. In the liquid crystal display device 100, the dot inversion driving enables desired image quality to be secured even in a case of a large-size liquid crystal display device, typically, a television set. That is, the gate driver 1 and the source driver 2 operate as described below.

That is, the gate driver 1 is configured to supply an identical gate drive signal to the gate lines GL1 and the gate lines GL2. Specifically, the gate driver 1 is connected to a common gate line GL12 to which the gate drive signal for driving the gate line GL1 and the gate line GL2 is supplied. The common gate line GL12 is separated into the gate line GL1 and the gate line GL2. In other words, the pixels P belonging to the pixel group P1 and the pixels P belonging to the pixel group P2 are brought into an on state at the same timing. The gate driver 1 and each gate line GL are configured such that similarly to the combination of the gate line GL1 and the gate line GL2, an identical gate drive signal is supplied to each of a combination of the gate line GL3 and the gate line GL4, ..., and a combination of the gate line GL(n−1) and the gate line GLn.

Moreover, the source driver 2 is configured to supply an identical source drive signal to the source lines SL_OE and to supply an identical source drive signal to the source lines SL_EO. In one frame, the source lines SL_OE are driven such that the source drive signal of the source lines SL_OE corresponds to the positive polarity, and the source lines SL_EC are driven such that the source drive signal of the source lines SL_EO corresponds to the negative polarity. In next one frame, the source lines SL_OE are driven such that the source drive signal of the source lines SL_OE corresponds to the negative polarity, and the source lines SL_EO are driven such that the source drive signal of the source lines SL_EO corresponds to the positive polarity. As a result, any two adjacent pixels of the plurality of pixels P are in a relationship of inversion polarity (i.e., one of the two pixels has the positive polarity and the other of the two pixels has the negative polarity). Thus, in the liquid crystal display device 100, the dot inversion driving is realized.

In the liquid crystal display device 100, the source lines SL closer to the source driver 2 have smaller time constants, and thus the pixels P closer to the source driver 2 require shorter charging times. That is, in the liquid crystal display device 100, a time required to charge the pixels P belonging to the pixel group P1 is shortest, and the time required to charge the pixels P increases in the order of the pixels P belonging to the pixel group P2, ..., the pixels P belonging to the pixel group Pn. Thus, in order to realize high-speed driving of the liquid crystal display device 100, the liquid crystal display device 100 is driven as described below according to the timing chart shown in FIG. 1.

In FIG. 1, the period t1 is a period corresponding to one frame of the liquid crystal display device 100.

A gate drive signal GSA is a gate drive signal for driving the gate line GL1 and the gate line GL2 (in other words, supplied to the common gate line GL12). A gate drive signal GSB is a gate drive signal for driving the gate line GL3 and the gate line GL4. A gate drive signal GSC is a gate drive signal for driving the gate line GL5 and the gate line GL6. The gate drive signal GSA, the gate drive signal GSB, and the gate drive signal GSC are pulse signals. Moreover, the pulse width of the gate drive signal GSA, the pulse width of the gate drive signal GSB, and the pulse width of the gate drive signal GSC are equal to one another and are each a pulse width GSa. The gate lines GL1 to GL6 correspond to a first group. Moreover, the gate lines GL1 and GL2 correspond to a first subgroup, and the gate lines GL3 to GL6 corresponds to a second subgroup. Moreover, the gate line GL1 is a gate line of the gate lines GL which is closest to the source driver 2, and thus, as described above, the gate line GL1 corresponds to the first proximal gate line.

A gate drive signal GSQ is a gate drive signal for driving the gate line GLm and the gate line GL(m+1). A gate drive signal GSR is a gate drive signal for driving the gate line GL(m+2) and the gate line GL(m+3). A gate drive signal GSS is a gate drive signal for driving the gate line GL(m+4)

and the gate line GL(m+5). Note that m is an integer larger than or equal to seven, and m+5 is smaller than or equal to n−6. The gate drive signal GSQ, the gate drive signal GSR, and the gate drive signal GSS are pulse signals. Moreover, the pulse width of the gate drive signal GSQ, the pulse width of the gate drive signal GSR, and the pulse width of the gate drive signal GSS are equal to one another and are each a pulse width GSq. The gate lines GLm to CL(m+5) correspond to one of the second groups.

A gate drive signal GSX is a gate drive signal for driving the gate line GL(n−5) and the gate line GL(n−4). A gate drive signal GSY is a gate drive signal for driving the gate line GL(n−3) and the gate line GL(n−2). A gate drive signal GSZ is a gate drive signal for driving the gate line GL(n−1) and the gate line GLn. The gate drive signal GSX, the gate drive signal GSY, and the gate drive signal GSZ are pulse signals. Moreover, the pulse width of the gate drive signal GSX, the pulse width of the gate drive signal GSY, and the pulse width of the gate drive signal GSZ are equal to one another and are each a pulse width GSx. The gate lines GL(n−5) to GLn correspond to another one of the second groups.

The pulse width GSa, the pulse width GSq, and the pulse width GSx are in the following relationship: pulse width GSa <pulse width GSq<pulse width GSx. In other words, the drive time of each of the gate lines GL1 to GL6 defined by the pulse width GSa is shorter than the drive time of each of the gate lines GLm to GL(m+5) defined by the pulse width GSq. Moreover, the drive time of each of the gate lines GL1 to GL6 and the drive time of each of the gate lines GLm to GL(m+5) are each shorter than the drive time of each of the gate line GL(n−5) to GLn defined by the pulse width GSx.

Note that in the present embodiment, each of the first group and two second groups includes six gate lines GL adjacent to each other. Note that the number of the gate lines GL included in the first group and the number of gate lines GL included in each second group are each at least one.

Moreover, in FIG. 1, the source drive signal in each source line SL_OE and the source drive signal in each source line SL_EO which the source driver 2 outputs are shown together. In FIG. 1, a potential COM denotes a potential of a counter electrode (not shown) included in the liquid crystal display device 100. Moreover, in FIG. 1, a signal SS_OE denotes the source drive signal in each source line SL_OE which the source driver 2 outputs, and a signal SS_EO denotes the source drive signal in each source line SL_EO which the source driver 2 outputs. Moreover, in FIG. 1, a potential VP_OE denotes the potential of a pixel electrode (not shown) of one of pixels P driven by the signal SS_OE, and a potential VP_EO denotes the potential of a pixel electrode of one of pixels P driven by the signal SS_EO. The signal SS_OE rises at a rising timing of the gate drive GSA, and then, the signal SS_OE repeatedly falls and rises in synchronism with a rise of each of the gate drive signals GSB to GSZ. On the other hand, the signal SS_EO falls at the rising timing of the gate drive signal GSA, and then, the signal SS_EO repeatedly rises and falls in synchronism with a rise of each of the gate drive signals GSB to GSZ. Each of the signal SS_OE and the signal SS_EO charges a corresponding one of the pixels P with the positive polarity during a period from the start of a rise to the start of a next fall and charges the corresponding one of the pixels P with the negative polarity during a period from the start of a fall to the start of a next rise.

In this embodiment, a period of one pulse of the signal SS_OE and the signal SS_EO corresponding to the gate drive signal GSA is defined as a period SSa. Moreover, a period of one pulse of the signal SS_OE and the signal SS_EO corresponding to the gate drive signal GSQ is defined as a period SSq. Furthermore, a period of one pulse of the signal SS_OE and the signal SS_EO corresponding to the gate drive signal GSX is defined as a period SSx. As described above, since pulse width GSa<pulse width GSq<pulse width GSx, the following relationship holds true: period SSa<period SSg>period SSx. In other words, this means that the pixels P closer to the source driver 2 have shorter charging times. Note that the period SSa (pulse width GSa) corresponds to a length of a period during which all the pixels P belonging to the pixel group P6 can be sufficiently charged by the signal SS_OE and the signal SS_EO. Moreover, the period SSq (pulse width GSq) corresponds to a length of a period during which all the pixels P belonging to the pixel group P(m+5) can be sufficiently charged by the signal SS_OE and the signal SS_EO. Furthermore, the period SSx (pulse width GSx) corresponds to a length of a period during which all the pixels P belonging to the pixel group Pn can be sufficiently charged by the signal SS_OE and the signal SS_EO.

In the liquid crystal display device 100, the distance of each pixel P to the source driver 2 and a time required to charge each pixel P are taken into consideration, and as the distance to the source driver 2 decreases, the charging time of each pixel P is reduced. Thus, it is possible to reduce an excessive time for charging pixels P close to the source driver 2 (in this embodiment, pixels P belonging to the pixel group P1 and pixels belonging to the pixel group P2). This enables the liquid crystal display device 100 to be driven at a further increased speed.

Figure 3:
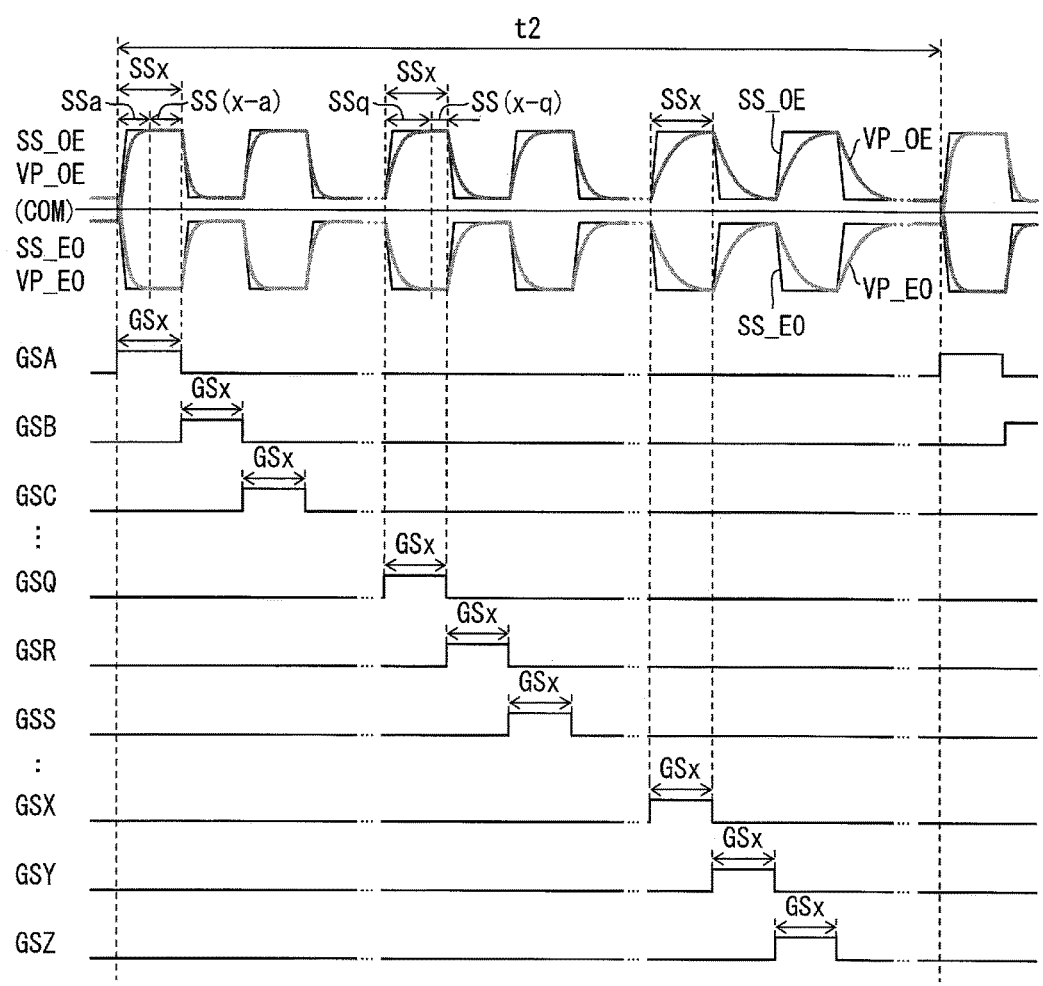
FIG. 3 is a timing chart illustrating driving of a liquid crystal display device according to a comparative example.

In this embodiment, in order to describe the effect of the liquid crystal display device 100 in more detail, the driving of the liquid crystal display device 100 shown in FIG. 1 is compared with driving of a liquid crystal display device according to a comparative example shown in FIG. 3. FIG. 3 is a timing chart illustrating the driving of the liquid crystal display device according to the comparative example.

As illustrated in FIG. 3, in the driving of the liquid crystal display device according to the comparative example, gate drive signals GSA to GSZ have all the same pulse width. In this case, to sufficiently charge all pixels P, in particular, all pixels P belonging to a pixel group Pn, the pulse width (drive time) of each of the gate drive signals GSA to GSZ has to be the pulse width GSx shown in FIG. 1.

In the driving of the liquid crystal display device according to the comparative example, the period of one pulse of signal SS_OE and a signal SS_EO during charging of all pixels P belonging to pixel groups P1 to P6 is a period SSx. However, charging of all pixels P belonging to the pixel groups P1 to P6 is actually completed in the period SSa (see FIG. 1) shorter than the period SSx. Thus, a period obtained by subtracting The period SSa from the period SSx (in FIG. 3, the period SS(x-a)) is a wasted period during the charging of all pixels P belonging to the pixel groups P1 to P6. Similarly, in the driving of the liquid crystal display device according to the comparative example, charging of all pixels P belonging to pixel groups Pm to P(m+5) is actually completed in the period SSq (see FIG. 1) shorter than the period SSx. Thus, a period (in FIG. 3, a period. SS(x-q)) obtained by subtracting the period SSx from the period SSq is a wasted period during the charging of all pixels P belonging to the pixel groups Pm to P(m+5).

Thus, the period t2 in FIG. 3 corresponding to one frame of the liquid crystal display device according to the comparative example also becomes longer than the above-described period t1 shown in FIG. 1.

Figure 4:
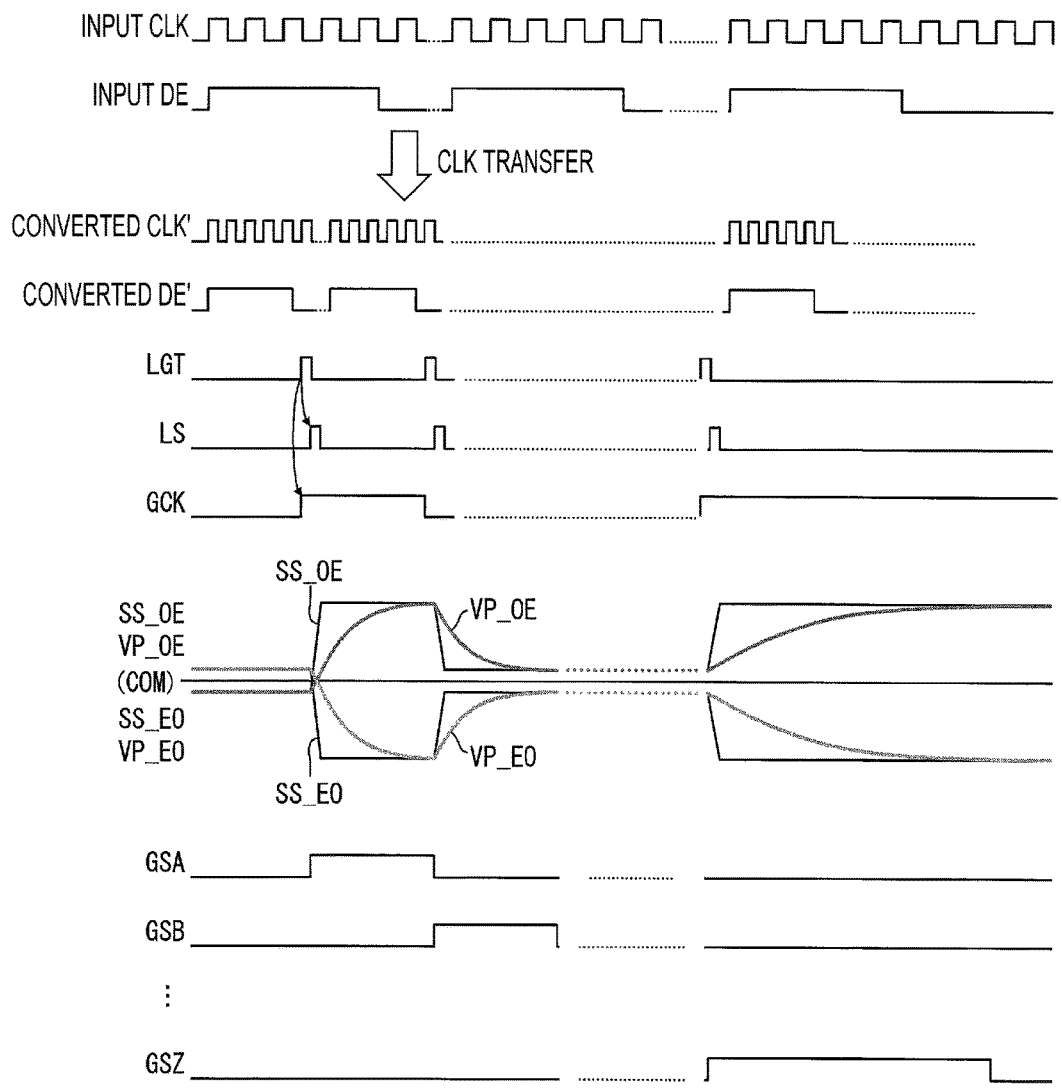
FIG. 4 is a timing chart illustrating how video data is converted along with the driving illustrated in FIG. 1.

FIG. 4 is a timing chart illustrating how video data is converted along with the driving illustrated in FIG. 1.

Although not show in FIG. 2, the liquid crystal display device 100 includes a video processing circuit (e.g., a known timing controller) including frame memory. During the driving of the liquid crystal display device 100, the frame memory accumulates data of one frame (how the data is accumulated is not shown). The data which is accumulated is synchronized with a clock which can be driven with a minimum gate line width (FIG. 1, the period SSa), and the data is supplied to the source device 2. The period SSa is determined in accordance with a longer one of a time of scanning (CLK frequency) of one horizontal interval corresponding to the driving speed of the source driver 2 and a minimum time in which at least one pixel P can be charged.

As illustrated in FIG. 4, the timing controller transfers an operation clock CLK, a data enable signal DE, and an image data signal DATA (not shown) which are input to the timing controller to, for example, a higher-speed operation clock in the timing controller to generate a converted operation clock CLK', a converted data enable signal DE', and a converted image data signal DATA' (not shown). The converted operation clock CLK', the converted data enable signal DE', and the converted image data signal DATA' are driven constantly, and the pulse widths of these signals are adjusted by the blanking interval of one horizontal interval and the timing of a latch signal LS. Thus, even when the source driver 2 is a known source driver, the driving shown in FIG. 1 becomes possible. This method also enables driving with a pulse width larger than one horizontal interval of the input signal, and thus, the driving is possible even in a case of a liquid crystal panel in which the driving was previously not possible. The latch signal LS and the gate clock GCK are generated by a signal LGT (LS, GCK timing). The signal LGT is a signal read from a look-up table (LUT) or the like in which signals configured in accordance with the time constant at each control location of the liquid crystal display device 100 are stored. Thus, even when the gate driver 1 is a known gate driver, the driving shown in FIG. 1 becomes possible.

According to the driving of the liquid crystal display device 100 described above, toe pulse widths of the gate drive signals GSA to GSZ are reduced on a side adjacent to the source driver 2 and are increased on a side away from the source driver 2 in accordance with the time constants of the source lines SL. Thus, a period corresponding to one frame can be reduced from the period t2 shown in FIG. 3 to the period t1 shown in FIG. 1.

[Second Embodiment]

Figure 5:
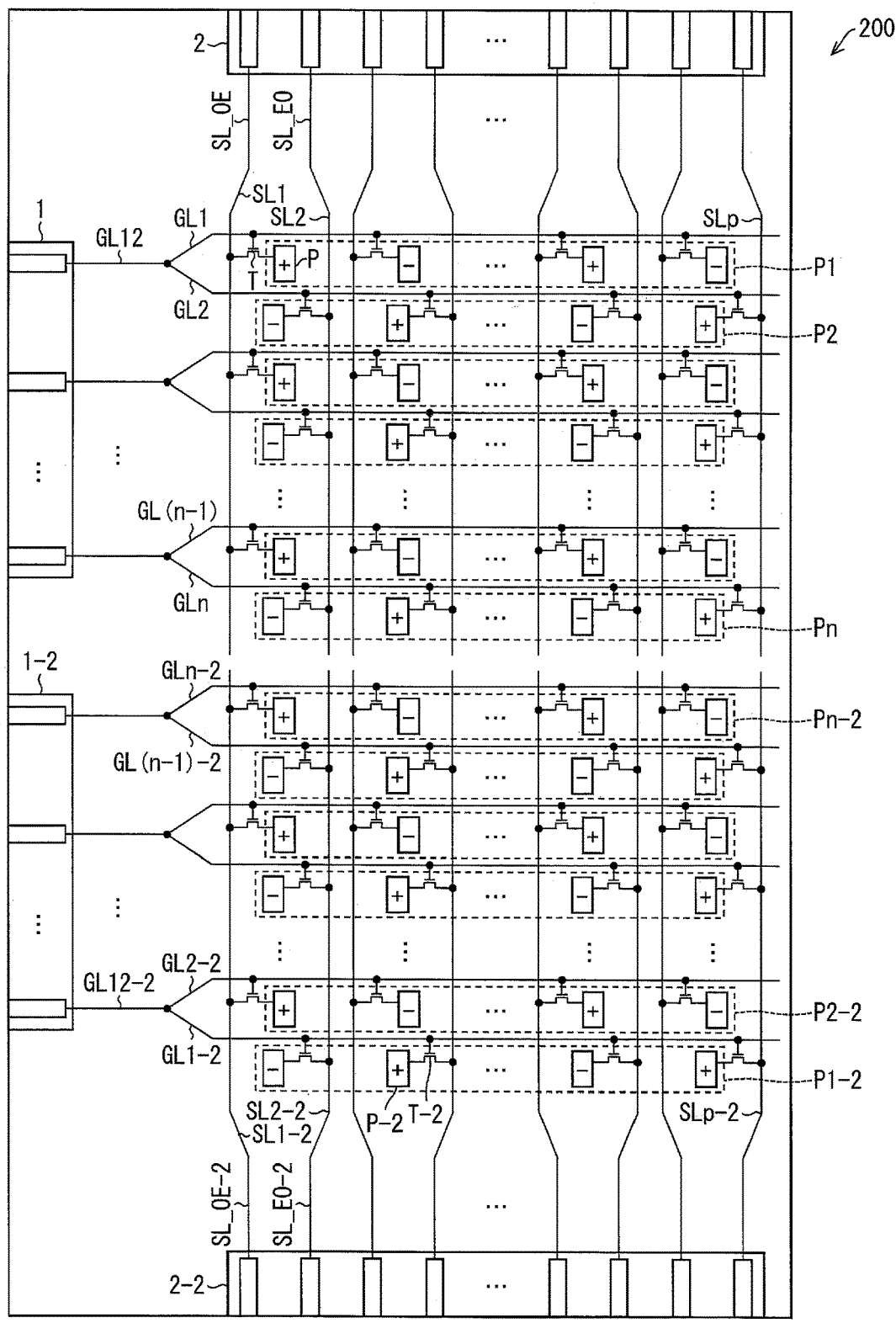
FIG. 5 is a block diagram illustrating main components of a liquid crystal display device according to a second embodiment of the present invention.
Figure 6:
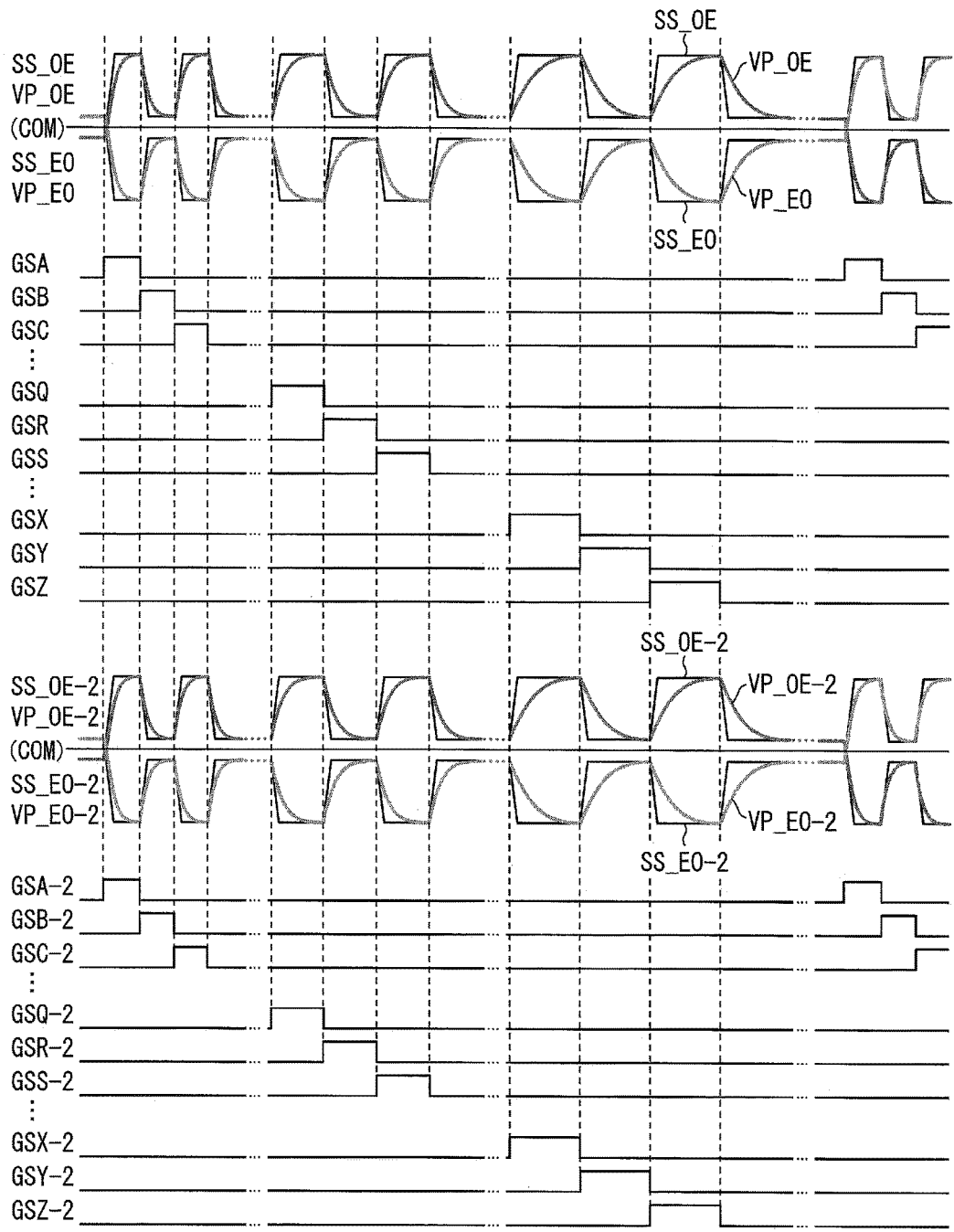
FIG. 6 is a timing chart illustrating driving of the liquid crystal display device according to the second embodiment of the present invention.

FIG. 5 is a block diagram illustrating main components of a liquid crystal display device 200 according to a second embodiment of the present invention. FIG. 6 is a timing chart illustrating driving of the liquid crystal display device 200 according to the second embodiment of the present invention.

An liquid crystal display device 200 illustrated in FIG. 5 includes, in addition to the components of the liquid crystal display device 100, n (a plurality of) gate lines (second gate lines) GL-2, p (a plurality of) source lines (second source line) SL-2, a plurality of transistors T-2 and pixels (second pixels) P-2, a gate driver 1-2, and a source driver (second source driver) 2-2.

In the liquid crystal display device 200, the gate lines GL-2 are arranged to intersect the source lines SL-2. The gate lines GL-2 are arranged from a side where the source driver 2-2 is provided, that is, from bottom to top in the order of a gate line (second proximal gate line) GL1-2, a gate line GL2-2, ..., a gate line GL(n−1)-2, and a gate line GLn−2. The source lines SL-2 are arranged in the order of a source line SL1-2, a source line SL2-2, ..., and a source line SLp-2 from the gate driver 1-2. The gate line GLn and the gate line GLn−2 are adjacent to each other in the up-down direction.

The transistor T-2 and the pixel P-2 are formed at least one of intersections of the n gate lines GL-2 and the p source lines SL-2. For one intersection of the gate line GL-2 and the source line SL-2, the gate of the transistor T-2 is connected to the gate line GL-2, the source of the transistor T-2 is connected to the source line SL-2, and the pixel P-2 is connected to the drain of the transistor T-2.

Here, the p source lines SL-2 are arranged from the source line SL1-2 to the source line SLp-2 in the order of a source line SL_OE-2, a source line SL_EO-2, a source line SL_EO-2, and a source line SL_OE-2 for each four source lines SL-2. Different signals may be supplied to the p source lines SL-2, but one of any two adjacent pixels of the plurality of pixels P-2 is driven by the source line SL_OE-2, and the other of the two adjacent pixels is driven by the source line SL_EO-2. A connection relationship between each source line SL-2 and each transistor T-2 and pixel P-2 is determined so as to be able to realize such driving.

Note that in FIG. 5, pixel groups P1-2 to Pn-2 are defined. The pixel groups P1-2 to Pn-2 are collections of pixels P-2 connected to the gate lines GL1-2 to GLn-2 respectively via the corresponding transistors T-2.

The gate driver 1-2 is disposed on a side of the source line SL1-2 and is configured to supply a gate drive signal to the n gate lines GL-2 to drive the n gate lines GL-2. The source driver 2-2 is disposed on a lower side of the gate line GL1-2 and is configured to supply a source drive signal (second drive signal) to the p source lines SL-2 to drive the p source lines SL-2. The source drive signal supplied to the p source lines SL from the source driver 2 and the source drive signal supplied to the p source lines SL-2 from the source driver 2-2 will be described later.

Here, the liquid crystal display device 200 is, similarly to the liquid crystal display device 100, driven by dot inversion driving and double-source driving. That is, the gate driver 1 and the source driver 2 operate in a similar manner to those of the liquid crystal display device 100, and the gate driver 1-2 and the source driver 2-2 operate as described below.

That is, the gate driver 1-2 is configured to supply an identical gate drive signal to the gate lines GL1-2 and the gate lines GL2-2. The principle of the supply is the same as the principle that the gate driver 1 supplies an identical gate drive signal to the gate line GL1 and the gate line GL2, and thus, the detailed description will be omitted in this embodiment. The gate driver 1-2 and each gate line GL-2 are configured such that similarly to the combination of the gate line GL1-2 and the gate line GL2-2, an identical gate drive signal is supplied to each of a combination of the gate line GL3-2 and the gate line GL4-2, ..., and a combination of the gate line GL(n−1)-2 and the gate line GLn-2.

Moreover, the source driver 2-2 is configured to supply an identical source drive signal to the source lines SL_OE-2 and to supply an identical source drive signal to the source lines SL_EO-2 based on a principle similar to the principle of the source driver 2. Note that in the liquid crystal display device 200, any adjacent pixel P and pixel P-2 respectively belonging to the pixel group Pn and the pixel group Pn-2 are in a relationship of inverted polarity. Thus, in the liquid crystal display device 200, the dot inversion driving is realized.

In the liquid crystal display device 200, the source lines SL-2 closer to the source driver 2-2 have smaller time constants, and thus, the pixels P-2 closer to the source driver 2-2 require shorter charging times. That is, in the liquid crystal display device 200, a time required to charge the pixels P-2 belonging to the pixel group P1-2 is shortest, and the time required to charge the pixels P-2 increases in the order of the pixels P-2 belonging to the pixel group P2-2, . . . , the pixels P-2 belonging to the pixel group Pn-2. Thus, in order to realize high-speed driving of the liquid crystal display device 200, the liquid crystal display device 200 is driven as described below according to the timing chart shown in FIG. 6.

It can be said that FIG. 6 is a figure in which the contents described below are added to the timing chart shown in FIG. 1.

A gate drive signal GSA-2 is a gate drive signal for driving the gate line GL1-2 and the gate line GL2-2. A gate drive signal GSB-2 is a gate drive signal for driving the gate line GL3-2 and the gate line GL4-2. A gate drive signal GSC-2 is a gate drive signal for driving the gate line GL5-2 and the gate line GL6-2. The gate drive signal GSA-2, the sate drive signal GSB-2, and the gate drive signal GSC-2 have the same rising timing, falling timing, and pulse width (pulse width GSa) as the gate drive signal GSA, the gate drive signal GSB, and the gate drive signal GSC respectively. The gate lines GL1-2 to GL6-2 correspond to a third group. Moreover, the gate line GL1-2 is a gate line of the gate lines GL-2 which is closest to the source driver 2-2, and thus, as described above, the gate line GL1-2 corresponds to the second proximal gate line.

A gate drive signal GSQ-2 is a gate drive signal for driving the gate line GLm-2 and the gate line GL(m+1)-2. A gate drive signal CSR-2 is a gate drive signal for driving the gate line GL(m+2)-2 and the gate line GL(m+3)-2. A gate drive signal CSS-2 is a gate drive signal for driving the gate line CL(m+4)-2 and the gate line GL(m+5)-2. The gate drive signal GSQ-2, the gate drive signal GSR-2, and the gate drive signal GSS-2 have the same rising timing, falling timing, and pulse width (pulse width GSq) as the gate drive signal GSQ, the gate drive signal GSR, and the gate drive signal GSS respectively. The gate lines GLm-2 to GL(m+5)-2 correspond to one of fourth groups.

A gate drive signal GSX-2 is a gate drive signal for driving the gate line GL(n−5)-2 and the gate line GL(n−4)-2. A gate drive signal GSY-2 is a gate drive signal for driving the gate line GL(n−3)-2 and the gate line GL(n−2)-2. A gate drive signal CSZ-2 is a gate drive signal for driving the gate line GL(n−1)-2 and the gate line GLn-2. The gate drive signal GSX-2, the gate drive signal GSY-2, and the gate drive signal CSG-2 have the same rising timing, falling timing, and pulse width (pulse width GSX) as the gate drive signal GSX, the gate drive signal GSY, and the gate drive signal CSZ respectively. The gate lines GL(n−5)-2 to GLn-2 correspond to another one of the fourth groups.

Note that in the present embodiment, each of the third group and the two fourth groups includes six gate lines GL-2 adjacent to each other. Note that the number of the gate lines GL-2 included in the third group and the number of gate lines GL-2 included in each fourth group are each at least one.

Moreover, in FIG. 6, a signal SS_OE-2 and a signal SS_EO-2 which the source driver 2-2 outputs are shown together. The signal SS_OE-2 is a source drive signal in each source line SL_OE-2. The signal SS_EO-2 is a source drive signal in each source line SL_EO-2. As shown in FIG. 6, the waveform of the signal SS_OE-2 and the waveform of the signal SS_EO-2 are respectively the same as the waveform of the signal SS_OE and the waveform of the signal SS_EO.

In the liquid crystal display device 200, the distance of each pixel P-2 to the source driver 2-2 and a time required to charge each pixel P-2 are taken into consideration, and as the distance to the source driver 2-2 decreases, the charging time of each pixel P-2 is reduced. Thus, it is possible to reduce an excessive time for charging pixels P-2 close to the source driver 2-2 (in this embodiment, pixels P-2 belonging to the pixel group P1-2 and the pixel group P2-2). This enables the liquid crystal display device 200 to be driven at a further increased speed.

Moreover, as can be clearly seen from FIG. 6, in the liquid crystal display device 200, it is possible to make waveforms of signals output from the gate driver 1 and the source driver 2 and waveforms of signals output from the gate driver 1-2 and the source driver 2-2 identical to each other. This enables these drivers to be driven collectively.

That is, if it is possible to drive a set of the gate driver 1 and the source driver 2 and a set of the gate driver 1-2 and the source driver 2-2 independently of each other, the waveforms of the signals output from the gate driver 1 and the source driver 2 may be different from the waveforms of signals output from the gate driver 1-2 and the source driver 2-2. However, this may complicate the structure of the liquid crystal display device 200. Making the waveforms of the signals output from the gate driver 1 and the source driver 2 and the waveforms of the signals output from the gate driver 1-2 and the source driver 2-2 identical to each other enables prevention of complication of the structure of the liquid crystal display device 200.

The liquid crystal display device 200 enables a further increase in size and/or definition as compared to the liquid crystal display device 100.

Note that in the description above, the gate lines GL, are driven sequentially in the order from the gate line GL1 close to the source drive 2, and the gate lines GL-2 are driven sequentially the order from the gate line GL1-2 close to the source drive 2-2, but the driving order of the gate lines is not limited to the description above. That is, the gate lines GL, may be driven sequentially in the order from the gate line GLn far from the source drive 2, and the gate lines GL-2 may be driven sequentially in the order from the gate line GLn-2 far from the source drive 2-2.

Moreover, an example in which the waveforms of the signals output from the gate driver 1 and the source driver 2 are different from the waveforms of the signals output from the gate driver 1-2 and the source driver 2-2 is as follows. That, the gate lines GL are driven sequentially in the order from the gate line GL1 close to the source drive 2, and the gate lines GL-2 are craven sequentially in the order from the gate line GLn-2 far from the source drive 2-2. Based on such an example, the liquid crystal display device 200 may be driven.

Moreover, in the liquid crystal display device 200, the number of gate lines GL and the number of gate lines GL-2 are the same (n). Note that the number of gate lines GL and the number of gate lines GL-2 may be different from each other.

[Third Embodiment]

Figure 7:
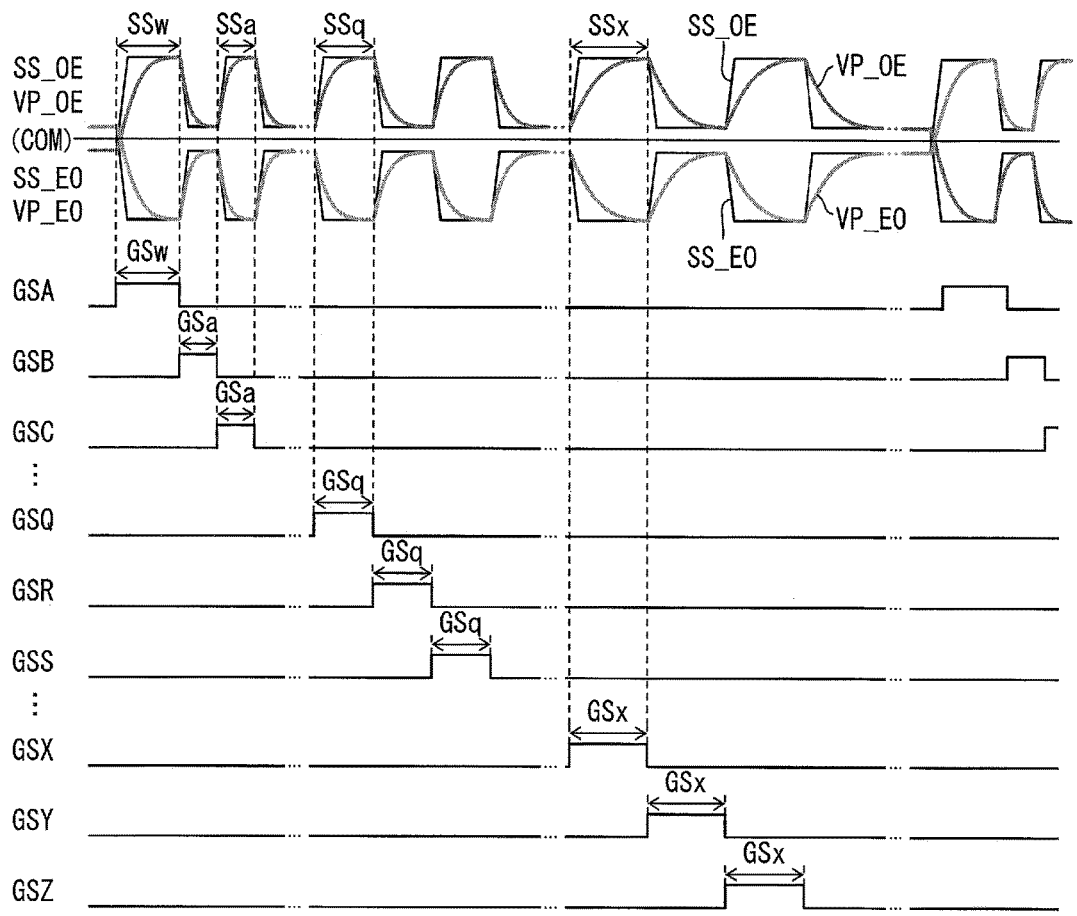
FIG. 7 is a timing chart illustrating driving of a liquid crystal display device according to a third embodiment of the present invention.

FIG. 7 is a timing chart illustrating driving of a liquid crystal display device 300 according to a third embodiment of the present invention. The configuration of the liquid crystal display device 300 is the same as the configuration of the liquid crystal display device 100 (see FIG. 2). The driving of the liquid crystal display device 300 is different from the driving of the liquid crystal display device 100 in the following points.

During the driving of the liquid crystal display device 300, a gate drive signal GSA has a pulse width GSw. The pulse width GSw is larger than the pulse width GSa. Note that, a period of one pulse of a signal SS_OE and a signal SS_EO corresponding to a gate drive signal GSA of FIG. 7 is a period SSw. On the other hand, the pulse width of each of gate drive signals GSB to GSZ in the liquid crystal display device 300 is the same as the pulse width of each of the gate drive signals GSB to GSZ in the liquid crystal display device 100. That is, all gate lines GL1 and GL2 included in a first subgroup each have a longer drive time in one frame than each one of gate lines GL3 to GL6 included in a second subgroup.

This enables the liquid crystal display device 300 drivable at a high speed to be realized while the charging time of each of the pixel groups P1 to Pn is optimized. That is, immediately after the start of a next frame following one frame, the polarity of the source drive signal is inverted (for a subsequent one frame, the polarity is not inverted). Thus, each source line SL has to be charged to an inverted polarity only at a polarity inversion timing of the source device signal, and thus the charging time has to be slightly increased. The liquid crystal display device 300 can sufficiently secure a time for charging each source line to the inverted polarity. Note that even when the configuration of the liquid crystal display device 300 is the same as the configuration of the liquid crystal display device 200, driving similar to that described above can be performed.

[Fourth Embodiment]

Figure 8:
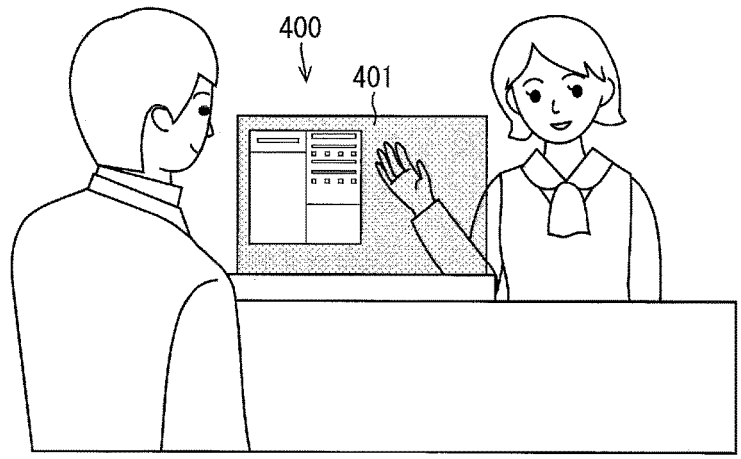
FIG. 8 is a view illustrating a liquid crystal display device according to a fourth embodiment of the present invention and the usage example of the liquid crystal display device.

FIG. 8 is a view illustrating a liquid crystal display device 400 according to a fourth embodiment of the present invention and a usage example of the liquid crystal display device 400. FIG. 8 shows the appearance of the liquid crystal display device 400. The liquid crystal display device 400 is one of the liquid crystal display device 100, the liquid crystal display device 200, and the liquid crystal display device 300. The liquid crystal display device 400 includes a display unit 401 for displaying an image, video, and the like. The display unit 401 is transparent.

As shown in FIG. 8, the liquid crystal display device 400 whose display unit 401 is transparent has a square shape in front view, but three of four sides of the square have no frame portion. Thus, the liquid crystal display device 400 enables an enlarged scope of application and design innovations to be realized with respect to conventional liquid crystal display devicees.

For example, in FIG. 8, a woman behind the liquid crystal display device 400 can show an object to a man in front of the liquid crystal display device 400 through the display unit 401. Moreover, even when the liquid crystal display device 400 is placed on a counter or the like, no strange feeling is caused, and thus, it can be said that the design of the liquid crystal display device 400 is excellent.

A technique for realizing transparency of the display unit 401 is a technique of omitting a color filter of the liquid crystal display device 400 to increase the transparency of the display unit 401. In order to realize such a technique, the liquid crystal display device 400 has to be driven by the color-field sequential system, that is, the RGB backlight (not shown) has to be switched by frame units, and thus, high-speed driving is required.

The liquid crystal display device 400 is one of the liquid crystal display device 100, the liquid crystal display device 200, and the liquid crystal display device 300, and thus, the high-speed driving is realized.

[Summary]

A liquid crystal display device according to a first aspect of the present invention includes a plurality of first gate lines (gate lines GL), a plurality of first source lines (source lines SL) disposed to intersect the plurality of first gate lines; a first pixel (pixel P) formed at least one of intersections of the plurality of first gate lines and the plurality of first source lines; a first source driver (source driver 2) configured to supply a first drive signal to end parts of the plurality of first source lines to drive the plurality of first source lines, wherein the plurality of first gate lines include a first group (gate lines GL1 to GL6) including one or a plurality of the first gate lines adjacent to each other, the first group including at least a first proximal gate line (gate line GL1) which is the first gate line closest to the first source driver, and a second group (gate lines GLm to GL(m+5) and gate lines GL(n−5) to GLn) including one or a plurality of the first gate lines adjacent to each other, the second group being disposed on an opposite side of the first group from the source driver, and at least all the first gate lines included in the first group except for the first proximal gate line each have a shorter driving time in one frame than each of the first gate lines included in the second group.

With the above-described configuration, the distance of each pixel to the first source driver and a time required to charge each pixel are taken into consideration, and as the distance to the first source driver decreases, a charging time of each pixel is reduced. Thus, it is possible to reduce excessive time for charging of pixels close to the first source driver. Thus, the above-described configuration enables driving at a further increased speed.

In particular, in a liquid crystal display device according to a second aspect referring to the first aspect, all the first gate lines included in the first group preferably each have a shorter driving time in one frame than each of the first gate lines included in the second group.

Moreover, in a liquid crystal display device according to a third aspect referring to the first aspect, the first group includes a first subgroup (gate line GL1 and gate line GL2) including one or a plurality of the first gate lines adjacent to each other, the first subgroup including at least the first proximal gate line, a second subgroup (gate lines GL3 to GL6) including one or a plurality of the first gate lines adjacent to each other, the second subgroup being disposed on an opposite side of the first subgroup from the source driver, and all the first gate lines included in the first subgroup have a longer driving time in one frame than all the first gate lines included in the second subgroup.

This configuration enables a liquid crystal display device drivable at a high speed to be realized while the charging time is optimized. That is, for example, when immediately after the start of a next frame following one frame, the polarity of the first drive signal is inverted (for a subsequent one frame, the polarity is not inverted), each first source line has to be charged to an inverted polarity only at a polarity inversion timing of the first device signal, and thus the charging time has to be slightly increased. With this configuration, it is possible to sufficiently secure a time for charging the first source lines to the inverted polarity.

Moreover, an liquid crystal display device according to a fourth aspect of the present invention referring to any one of the first to third aspects further includes a plurality of second gate lines (gate lines GL-2); a plurality of second source lines (source lines SL-2) disposed to intersect the plurality of second gate lines; a second pixel (pixel P-2) formed at least one of intersections of the plurality or second gate lines and the plurality of second source lines; a second source driver (source driver 2-2) configured to supply a second drive signal to end parts of the plurality of second source lines to drive the plurality of second source lines, wherein the plurality of second gate lines include a third group (gate lines GL1-2 to GL6-2) including one or a plurality of the second gate lines adjacent to each other, the third group including at least a second proximal gate line (gate line GL1-2) which is the second gate line closest to the second source driver, and a fourth group (gate lines GLm−2 to GL(m+5)-2 and gate lines GL(n−5)-2 to GLn−2) including one or a plurality of the second gate lines adjacent to each other, the fourth group being disposed on an opposite side of the third group from the second source driver, all the second gate lines included in at least the third group except for the second proximal gate line each have a shorter driven g time in one frame than each of the second gate lines included in the fourth group, the third group is driven while the first group is driven, and the fourth group is driven while the second group is driven.

This configuration enables the waveform of a signal output from the first source driver and the waveform of a signal output from the second source driver to be made identical to each other. This enables these drivers to be driven collectively.

Moreover, a liquid crystal display device according to a fifth aspect of the present invention referring to, for example, any one of the first to fourth aspects further includes a display which is transparent.

The present invention is not limited to the embodiments described above. Various modifications may be made within the scope of the claims. Embodiments obtained by accordingly combining the techniques disclosed in different embodiments are also within the technical scope of the present invention. Moreover, combining technical means disclosed in the embodiments can provide new technical feature.

REFERENCE SIGNS LIST

1 GATE DRIVER
1-2 GATE DRIVER
2 SOURCE DRIVER (FIRST SOURCE DRIVER)
2-2 SOURCE DRIVER (SECOND SOURCE DRIVER)
100 LIQUID CRYSTAL DISPLAY DEVICE
200 LIQUID CRYSTAL DISPLAY DEVICE
300 LIQUID CRYSTAL DISPLAY DEVICE
400 LIQUID CRYSTAL DISPLAY DEVICE
401 DISPLAY UNIT
GL GATE LINE (FIRST GATE LINE)
GL1 GATE LINE (FIRST PROXIMAL GATE LINE)
GL-2 GATE LINE (SECOND GATE LINE)
GL1-2 GATE LINE (SECOND PROXIMAL GATE LINE)
P PIXEL (FIRST PIXEL)
P-2 PIXEL (SECOND PIXEL)
SL SOURCE LINE (FIRST SOURCE LINE)
SL-2 SOURCE LINE (SECOND SOURCE LINE)

The invention claimed is:

1. A liquid crystal display device comprising:
a plurality of first gate lines;
a plurality of second gate lines;
a plurality of first source lines disposed to intersect the plurality of first gate lines;
a plurality of second source lines disposed to intersect the plurality of second gate lines;
a first pixel formed at least one of intersections of the plurality of first gate lines and the plurality of first source lines;
a second pixel formed at least one of intersections of the plurality of second gate lines and the plurality of second source lines;
a first source driver configured to supply a first drive signal to end parts of the plurality of first source lines to drive the plurality of first source lines; and
a second source driver configured to supply a second drive signal to end parts of the plurality of second source lines to drive the plurality of second source lines, wherein
the plurality of first gate lines include
a first group including one or a plurality of the first gate lines adjacent to each other, the first group including at least a first proximal gate line which is the first gate line closest to the first source driver and
a second group including one or a plurality of the first gate lines adjacent to each other, the second group being disposed on an opposite side of the first group from the source driver,
the plurality of second gate lines include
a third group including one or a plurality of the second gate lines adjacent to each other, the third group including at least a second proximal gate line which is the second gate line closest to the second source driver and
a fourth group including one or a plurality of the second gate lines adjacent to each other, the fourth group being disposed on an opposite side of the third group from the second source driver,
at least all the first gate lines included in the first group except for the first proximal gate line each have a shorter driving time in one frame than each of the first gate lines included in the second group,
all the second gate lines included in at least the third group except for the second proximal gate line each have a shorter driving time in one frame than each of the second gate lines included in the fourth group,
the third group is driven while the first group is driven, and
the fourth group is driven while the second group is driven.

2. The liquid crystal display device according to claim 1, wherein
all the first gate lines included in the first group each have a shorter driving time in one frame than each of the first gate lines included in the second group.

3. The liquid crystal display device according to claim 1, wherein
the first group includes
a first subgroup including one or a plurality of the first gate lines adjacent to each other, the first subgroup including at least the first proximal gate line, and
a second subgroup including one or a plurality of the first gate lines adjacent to each other, the second subgroup being disposed on an opposite side of the first subgroup from the source driver, and
all the first gate lines included in the first subgroup have a longer driving time in one frame than all the first gate lines included in the second subgroup.

4. The liquid crystal display device according to claim 1, comprising
a display which is transparent.

* * * * *